(12) United States Patent
Lim (10) Patent No.: US 7,656,954 B1
(45) Date of Patent: Feb. 2, 2010

(54) SINGLE-ENDED TRI-LEVEL ENCODING/DECODING

(75) Inventor: Peter J. Lim, Saratoga, CA (US)

(73) Assignee: NVIDIA Corporation, Santa Clara, CA (US)

( * ) Notice: Subject to any disclaimer, the term of this patent is extended or adjusted under 35 U.S.C. 154(b) by 598 days.

(21) Appl. No.: 11/292,372

(22) Filed: Nov. 30, 2005

(51) Int. Cl.
*H04B 14/04* (2006.01)
*H04B 3/00* (2006.01)

(52) U.S. Cl. ...................................... 375/242; 375/257
(58) Field of Classification Search ................. 375/257, 375/286, 377; 326/56
See application file for complete search history.

(56) References Cited

U.S. PATENT DOCUMENTS

| | | | |
|---|---|---|---|
| 5,448,076 A * | 9/1995 | Krause ....................... 250/551 |
| 6,377,512 B1 * | 4/2002 | Hamamoto et al. ..... 365/233.17 |
| 6,556,628 B1 | 4/2003 | Poulton | |
| 6,563,352 B1 * | 5/2003 | Gohel et al. ................. 327/108 |
| 6,911,983 B2 * | 6/2005 | Sabella et al. ............... 345/536 |
| 6,956,401 B1 * | 10/2005 | Tyhach et al. .................. 326/80 |
| 2003/0038740 A1 * | 2/2003 | Mulder et al. ................ 341/144 |
| 2004/0135755 A1 * | 7/2004 | Hong ........................... 345/89 |

OTHER PUBLICATIONS

Sim et al., "Multilevel Differential Encoding With Precentering for High-Speed Parallel Link Transceiver" IEEE: Journal of Solid-State Circuits, vol. 40, No. 8, pp. 1688-1694, Aug. 2005.

* cited by examiner

*Primary Examiner*—Khanh C Tran
(74) *Attorney, Agent, or Firm*—Berkeley Law & Technology Group, LLP (57) ABSTRACT

Embodiments for single-ended tri-level encoding and/or decoding of data are disclosed.

21 Claims, 9 Drawing Sheets

SINGLE-ENDED TRI-LEVEL ENCODING/DECODING

BACKGROUND

This disclosure is related to data encoding and/or decoding.

As interfaces between components in computing platforms and/or between units within integrated circuits increase in transmission speed and/or bus width, noise and signal integrity issues increase in importance. For parallel data busses, for example data busses coupling memory devices to memory controllers, a supply current may vary with different output codes. The output code dependent supply current may result in power supply noise as the output code changes, possibly leading to signal integrity problems.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

"Logic" as referred to herein relates to structure for performing one or more logical operations. For example, logic may comprise circuitry which provides one or more output signals based at least in part on one or more input signals. Such circuitry may comprise a finite state machine which receives a digital input signal and provides a digital output signal, or circuitry which provides one or more analog output signals in response to one or more analog input signals. Such circuitry may be provided, for example, in an application specific integrated circuit (ASIC) and/or a field programmable gate array (FPGA). Also, logic may comprise machine-readable instructions stored in a storage medium in combination with a processor or other processing circuitry to execute such machine-readable instructions. However, these are merely examples of structures which may provide logic and claimed subject matter is not limited in these respects.

Unless specifically stated otherwise, as apparent from the following discussion, it is appreciated that throughout this specification discussions utilizing terms such as "processing," "computing," "calculating," "selecting," "forming," "enabling," "inhibiting," "identifying," "initiating," "querying," "obtaining," "hosting," "maintaining," "representing," "modifying," "receiving," "transmitting," "storing," "determining" and/or the like refer to the actions and/or processes that may be performed by a computing platform, such as a computer or a similar electronic computing device, that manipulates and/or transforms data represented as physical, electronic and/or magnetic quantities and/or other physical quantities within the computing platform's processors, memories, registers, and/or other information storage, transmission, reception and/or display devices. Accordingly, a computing platform refers to a system or a device that includes the ability to process and/or store data in the form of signals. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform.

Figure 1:
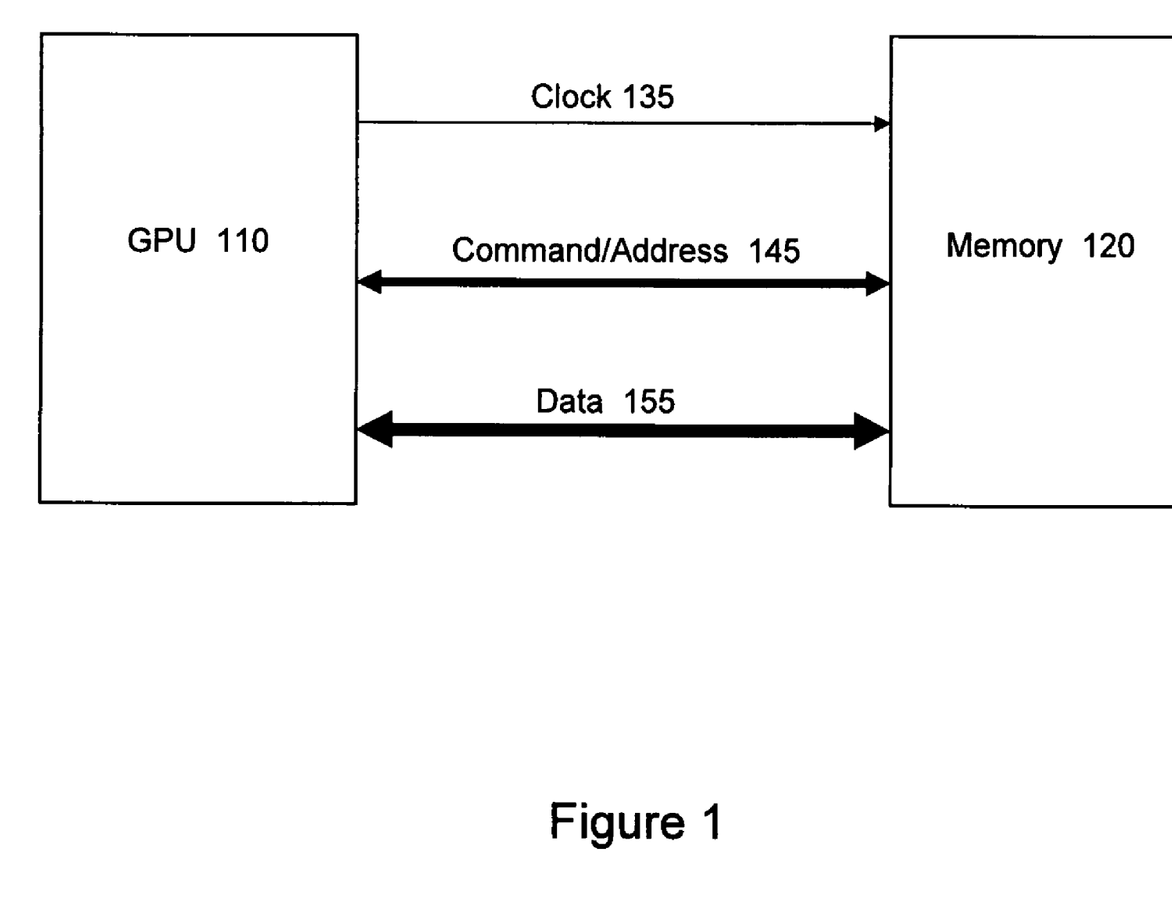
FIG. 1 is a block diagram of an example embodiment of a graphics processing unit coupled to a memory device via a data transfer interface.

FIG. 1 is a block diagram of an example embodiment of a graphics processing unit (GPU) 110 coupled to a memory device 120 via a data transfer interface. For this example embodiment, the data transfer interface may comprise one or more data lines 155, one or more address/control lines 145, and a clock signal 135, although the scope of the claimed subject matter is not limited in this respect. GPU 110 and memory device 120 are merely examples of component and/or device and/or unit types that may be coupled via data transfer interfaces, and the scope of the claimed subject matter is not limited in this respect.

For this example embodiment, the one or more data lines 155 may comprise single-ended data lines. The term "single-ended" as used herein is meant to include any data signaling technologies where a signal is delivered from a transmitting device or unit to a receiving device or unit over a single wire as opposed to two wires as is the case with differential signaling. A number of single-ended data lines may be configured to operate together as a parallel data interface.

Figure 2:
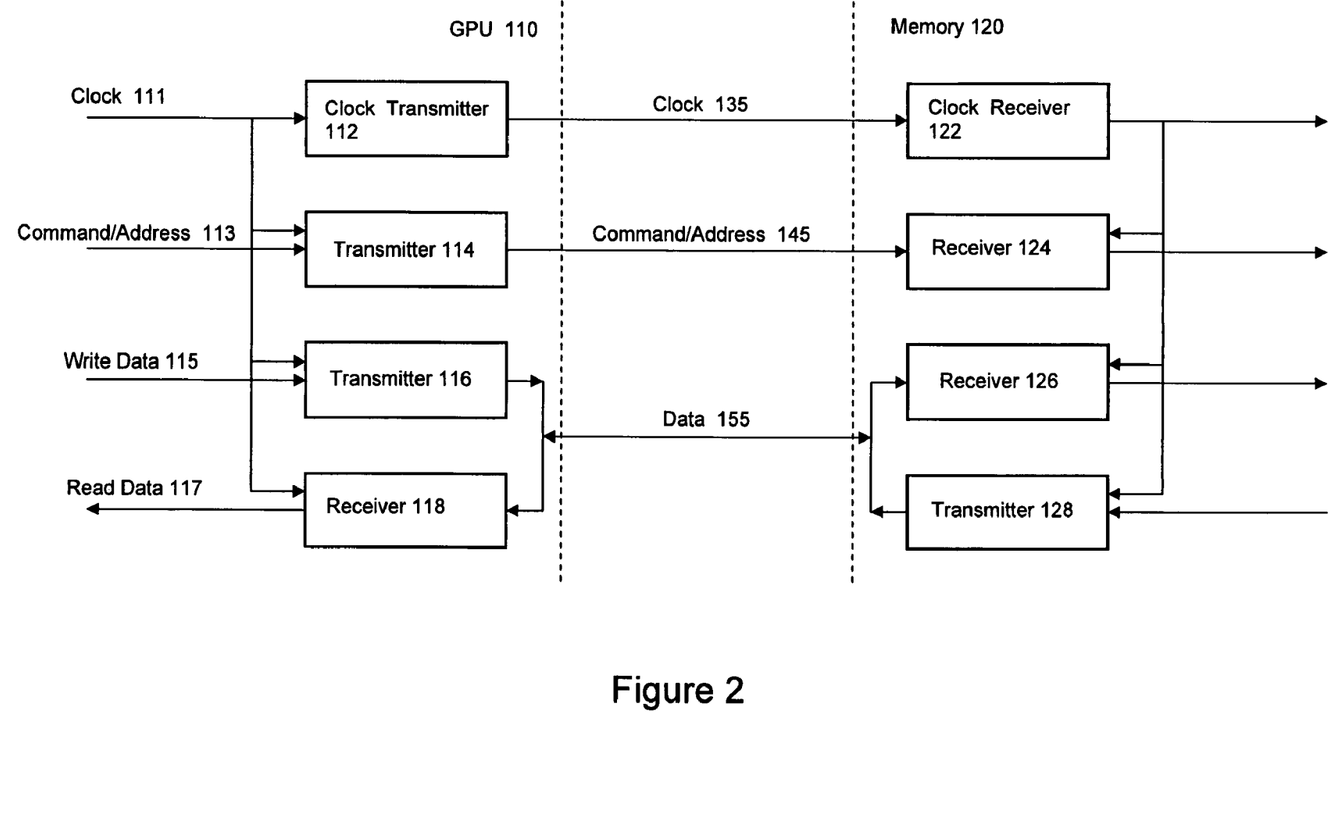
FIG. 2 is a block diagram of an example embodiment of a graphics processing unit coupled to an example embodiment of a memory device.

FIG. 2 is a block diagram of an example embodiment of graphics processing unit 110 coupled to an example embodiment of memory device 120. GPU 110 for this example may comprise a clock transmitter circuit 112, a command/address transmitter circuit 114, a write data transmitter circuit 116, and a read data receiver circuit 118. A clock signal 111 may be delivered to circuits 112, 114, 116, and 118. Memory device 120 may comprise a clock receiver circuit 122, a command/address receiver circuit 124, a data receiver circuit 126, and a data transmitter circuit 128.

Clock transmitter circuit 112 may transmit the clock signal to clock receiver circuit 122 within memory device 120 via a clock signal 135. Command/Address transmitter circuit 114 may transmit command and/or address information to command address receiver circuit 124 via one or more command/address signals 145. Write data transmitter circuit 116 may transmit data to data receiver circuit 126 via one or more data lines 155. Read data receiver circuit 118 may receive data transmitted by data transmitter circuit 128 via the one or more data lines 155.

For this example embodiment, data lines 155 may comprise one or more single-ended data lines. Further, for this example embodiment, data may be transmitted and/or received over data lines 155 using tri-level signaling. As used herein, the term "tri-level signal" is meant to include any signal that may take any of three states at a given time. For one example embodiment, a first state may comprise a logically high voltage level ("1"), a second state may comprise a logically intermediate voltage level ("0"), and a third state may comprise a logically low voltage level ("−1"). Also for an embodiment, the logically high voltage level may be approximately equal in value to a supply voltage. The logically intermediate voltage level may be approximately equal in value to a first voltage less than the supply voltage, and the logically low voltage level may be approximately equal in value to a second voltage less than the supply voltage. The logically low voltage level may be less in value than the logically intermediate voltage level. For one embodiment, the logically low voltage level may be approximately equal to zero volts (ground).

Although GPU 110 and memory device 120 are shown with a particular configuration of circuits and signals, a wide range of other embodiments are possible with other configurations of circuits and signals. Also, GPU and memory device 120 are merely examples of transmitting and/or receiving devices, and the scope of the claimed subject matter is not limited in these respects.

Figure 3:
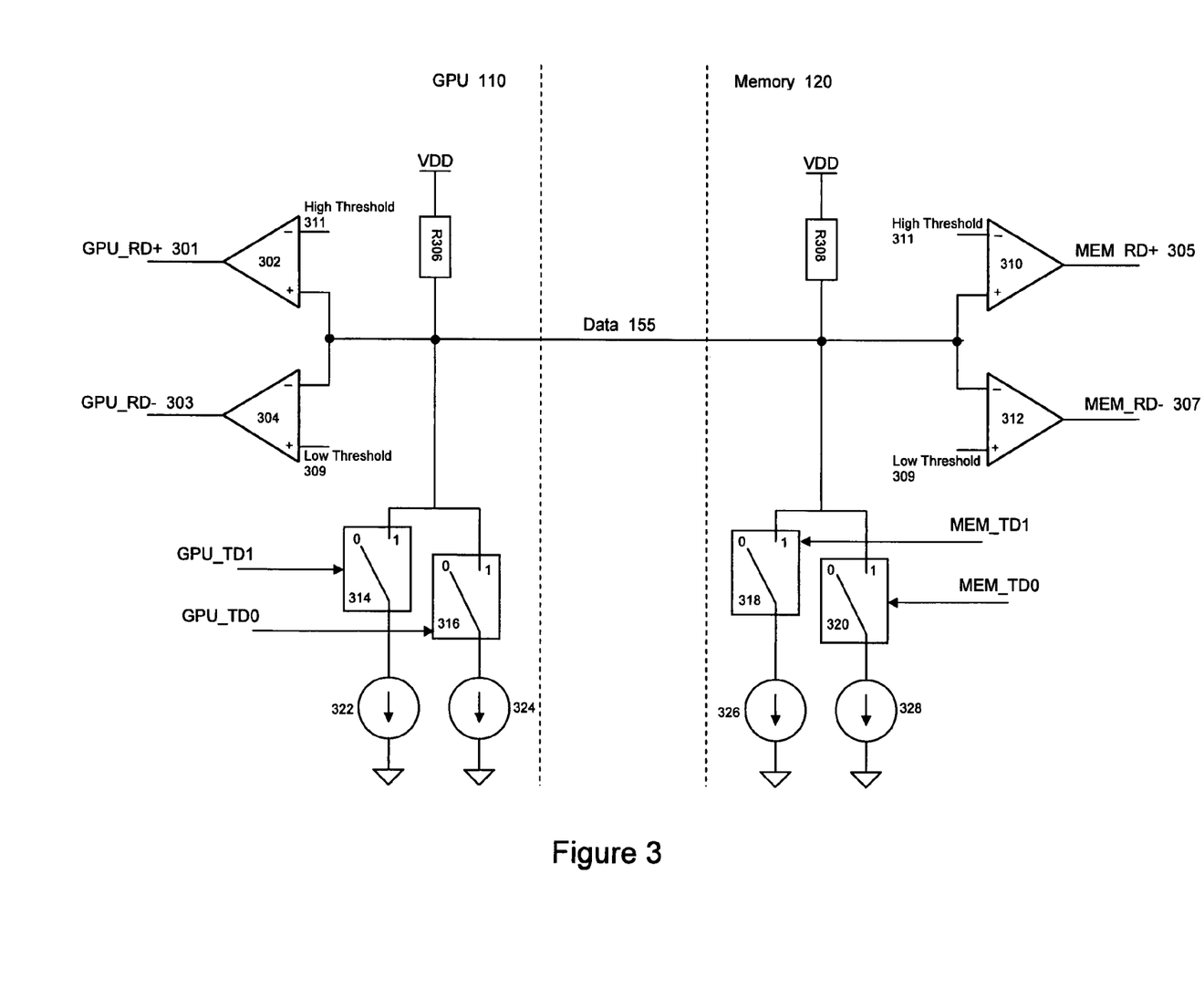
FIG. 3 is a block diagram of an example embodiment of a graphics processing unit coupled to an example embodiment of a memory device.

FIG. 3 is a block diagram of an example embodiment of graphics processing unit 110 coupled to an example embodiment of memory device 120. The embodiment of FIG. 3 may correspond to data transmitting and/or receiving circuits discussed above in connection with FIG. 2. GPU 110 for this example includes a pull-up resistor 306 coupled to a supply voltage VDD and a data line 155. GPU 110 may also include a comparator 302 and a comparator 304. Comparators 302 and 304 for this example embodiment may function as a receiver circuit. Comparator 302 has one input coupled to data line 155 and another input coupled to a high threshold voltage signal 311. Comparator 304 for this example has one input coupled to data line 155 and another input coupled to a low threshold voltage signal 309. Comparator 302 is capable of generating a first GPU read signal (GPU_RD+) 301 and comparator 304 is capable of generating a second GPU read signal (GPU_RD−) 302. The states of signals 301 and 303 may depend at least in part on the state of data line 155 as compared to the high and low threshold voltage levels. For an embodiment, high threshold voltage signal 311 may have a voltage level approximately equal to VDD−0.125 volts and low threshold voltage signal 309 may have a voltage level approximately equal to VDD−0.375 volts, although the scope of the claimed subject matter is not limited in these respects.

GPU 110 for this example may include a switch 314 and a switch 316. Switches 314 and 316 may provide connectivity, when enabled, between current sources 322 and 324 and data line 155. Assuming for the moment that memory device 120 is not transmitting, if neither of current sources 322 and 324 are coupled to data line 155, data line 155 is pulled up to a voltage level approximately equal to VDD through pull-up resistor 306. For this example embodiment, the voltage level approximately equal to VDD may comprise a logically high voltage level ("1"). If one of current sources 322 and 324 are coupled to data line 155, data line 155 may be pulled to a voltage level comprising a logically intermediate voltage level ("0"). For one embodiment, the intermediate voltage level may comprise a voltage approximately equally to VDD−0.25 volts, although the scope of the claimed subject matter is not limited in this respect. If both current sources 322 and 324 are coupled to data line 155, data line 155 may be pulled to a voltage level comprising a logically low voltage level ("−1"). For one embodiment, the logically low voltage level may comprise a voltage approximately equal to VDD−0.5 volts, although the scope of the claimed subject matter is not limited in this respect. For this example embodiment, switches 314 and 316 may be enabled by a first GPU transmit data signal (GPU_TD1) and a second GPU transmit data signal (GPU_TD0), respectively.

Memory device 120 for this example includes a pull-up resistor 308 coupled to supply voltage VDD and data line 155. Memory device 120 may also include a comparator 310 and a comparator 312. Comparators 310 and 312 for this example embodiment may function as a receiver circuit. Comparator 310 may have one input coupled to data line 155 and another input coupled to high threshold voltage signal 311. Comparator 312 for this example may have one input coupled to data line 155 and another input coupled to low threshold voltage signal 309. Comparator 310 may be capable of generating a first memory read signal (MEM_RD+) 305 and comparator 312 may be capable of generating a second memory read signal (MEM_RD−) 307. The states of signals 305 and 307 may depend at least in part on the state of data line 155 as compared to the high and low threshold voltage levels.

Memory device 120 for this example may include a switch 318 and a switch 320. Switches 318 and 320 may provide connectivity, when enabled, between current sources 326 and 328 and data line 155. Assuming for the moment that GPU 110 is not transmitting, if neither of current sources 326 and 328 are coupled to data line 155, data line 155 is pulled up to the logically high voltage level through pull-up resistor 308. If one of current sources 326 and 328 are coupled to data line 155, data line 155 may be pulled to a voltage level comprising the logically intermediate voltage level. If both current sources 326 and 328 are coupled to data line 155, data line 155 may be pulled to a voltage level comprising the logically low voltage level. For this example embodiment, switches 318 and 320 may be enabled by a first memory transmit data signal (MEM_TD1) and a second memory transmit data signal (MEM_TD0), respectively.

For the example embodiments described herein, the various switches may comprise any circuit capable of conducting current when enabled and further capable of not conducting current when not enabled. One example of a switch comprises a transistor, although the scope of the claimed subject matter is not limited in this respect. Also, the various current sources may comprise any circuit capable of sourcing current. For one embodiment, the current sources may be capable of sourcing 10 mA, although the scope of the claimed subject matter is not limited in this respect.

Figure 4:
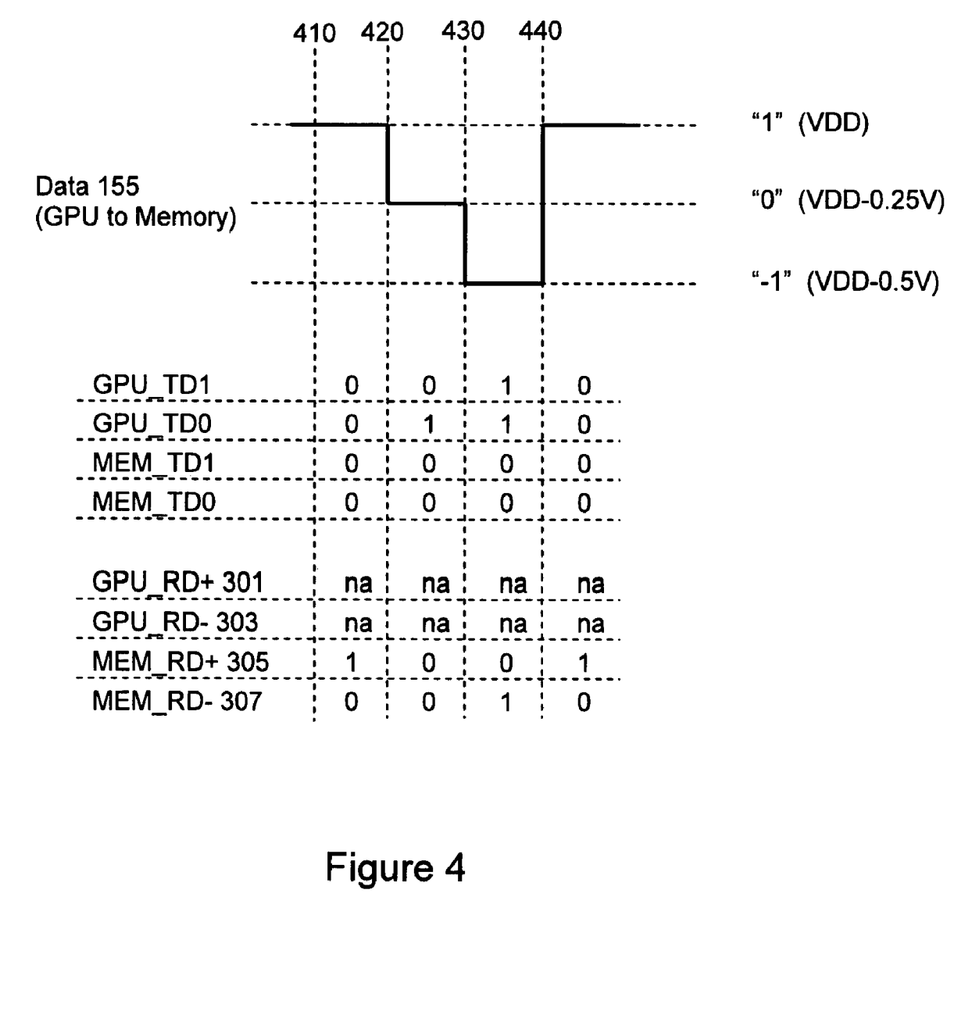
FIG. 4 is a timing diagram depicting an example waveform of a data signal transmitted from a graphics processing unit to a memory device in accordance with an embodiment.

FIG. 4 is a timing diagram depicting an example waveform of a data signal 155 transmitted from graphics processing unit 110 to memory device 120 in accordance with the embodiments discussed above in connection with FIGS. 1-3. For this example, GPU 110 is transmitting to memory device 120. Therefore, MEM_TD1 and MEM_TD0 have a value of 0 throughout the duration of the example timing diagram. At time 410, GPU_TD1 and GPU_TD0 have values of 0. As a result, neither switch 314 nor switch 316 are enabled, and data line 155 has a value of 1. Because data line 155 has a value of 1, MEM_RD+ 305 has a value of 1 and MEM_RD− 307 has a value of 0. Note that the GPU_TD1, GPU_TD0, MEM_TD1, MEM_TD0, GPU_RD+, GPU_RD−, MEM_RD+, and MEM_RD− signals use bi-level signaling for this example where "1" represents a logically high voltage level and "0" represents a logically low voltage level. These voltage levels may differ from those used for the tri-level signaling on data line 155.

At time 420, GPU_TD0 transitions from 0 to 1, and as a result data line 155 goes to the logically intermediate voltage level ('0'). MEM_RD+ 305 and MEM_RD− 307 each have a value of 0 as a result of data line 155 reaching the logically intermediate voltage level.

At time 430, GPU_TD1 transitions from 0 to 1, and as a result data line 155 goes to the logically low voltage level ('−1'). MEM_RD+ 305 remains at 0, and MEM_RD− 307 transitions to 1 as a result of data line 155 reaching the logically low voltage level.

At time 440, GPU_TD1 and GPU_TD0 transition to 0, and as a result both switches 314 and 316 are open. Data line 155 is pulled up to the logically high voltage level as a result, and MEM_RD+ 305 transitions to 1 while MEM_RD− 305 transitions to 0. Of course, the above example waveform is merely one example of possible transitions and/or states of a data line, and the scope of the claimed subject matter is not limited in these respects.

Figure 5:
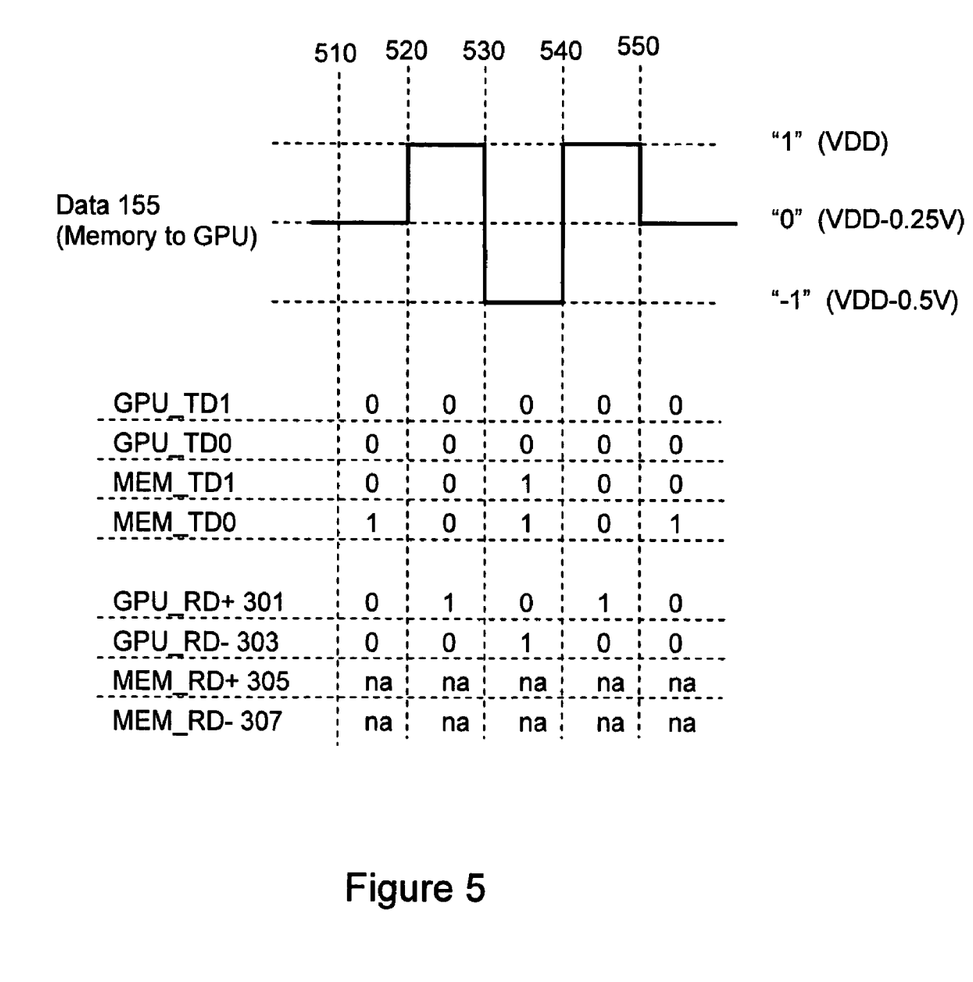
FIG. 5 is a timing diagram depicting an example waveform of a data signal transmitted from a memory device to a graphics processing unit in accordance with an embodiment.

FIG. 5 is a timing diagram depicting an example waveform of data signal 155 transmitted from memory device 120 to GPU 110 in accordance with the embodiments discussed above in connection with FIGS. 1-3. For this example, memory device 120 is transmitting to GPU 110. Therefore, GPU_TD1 and GPU_TD0 have a value of 0 throughout the duration of the example timing diagram. At time 510, MEM_TD1 has a value of 0 and MEM_TD0 has a value of 1. As a result, switch 320 is enabled and switch 318 is not enabled, and data line 155 has a value of 0 (intermediate voltage level). Because data line 155 is at the intermediate voltage level, GPU_RD+ 301 and GPU_RD− 303 have values of 0. Note again that the GPU_TD1, GPU_TD0, MEM_TD1, MEM_TD0, GPU_RD+, GPU_RD−, MEM_RD+, and MEM_RD− signals use bi-level signaling for this example where "1" represents a logically high voltage level and "0" represents a logically low voltage level. These voltage levels may differ from those used for the tri-level signaling on data line 155.

At time 520, MEM_TD0 transitions from 1 to 0, and as a result data line 155 goes to the logically high voltage level ('1'). GPU_RD+ 301 has a value of 1 and GPU_RD− 303 has a value of 0 as a result of data line 155 reaching the logically high voltage level.

At time 530, MEM_TD1 and MEM_TD0 both transition from 0 to 1, and as a result data line 155 goes to the logically low voltage level ('−1'). GPU_RD+ 301 transitions from 1 to 0, and GPU_RD− 303 transitions from 0 to 1 as a result of data line 155 reaching the logically low voltage level.

At time 540, MEM_TD1 and MEM_TD0 both transition to 0, and as a result both switches 318 and 320 are open. Data line 155 is pulled up to the logically high voltage level as a result, and GPU_RD+ 301 transitions to 1 while GPU_RD− 303 transitions to 0. At time 550, MEM_TD0 transitions from 0 to 1, and as a result data line 155 goes to the logically intermediate voltage level. GPU_RD+ 301 and GPU_RD− 303 have a value of 0. Of course, the above example waveform is merely one example of possible transitions and/or states of a data line, and the scope of the claimed subject matter is not limited in these respects.

Figure 6:
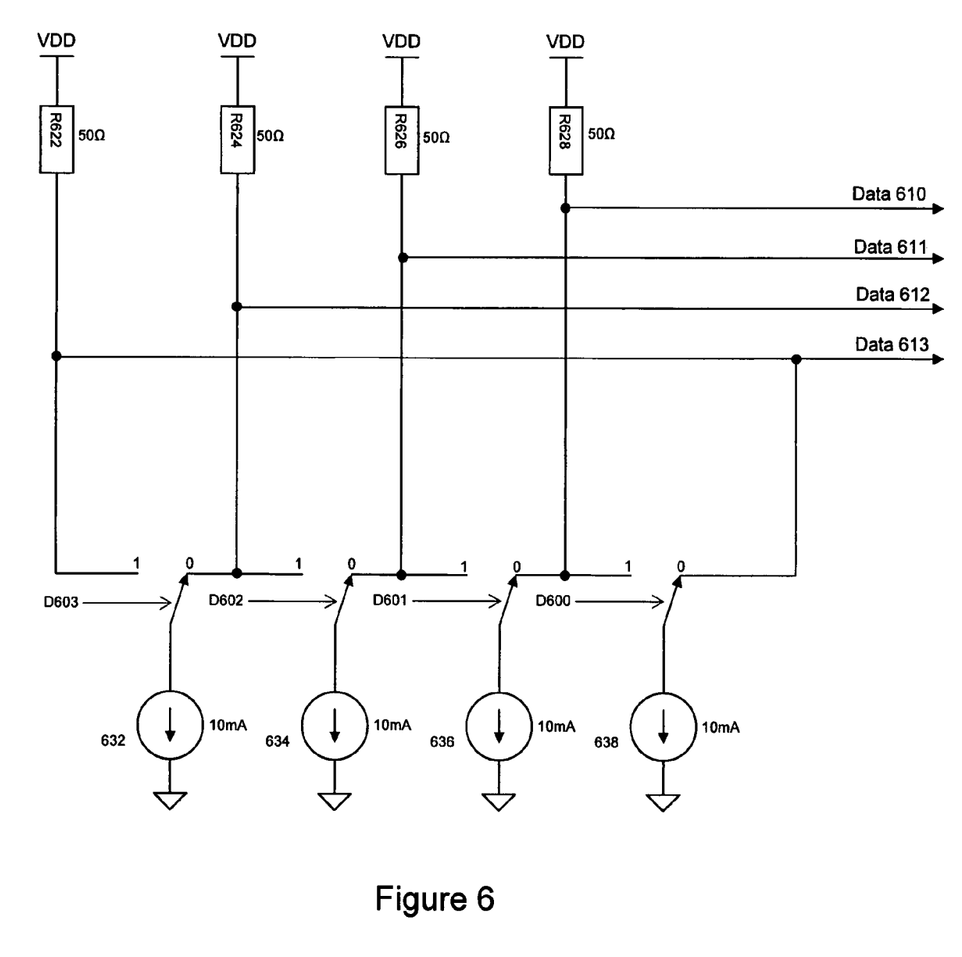
FIG. 6 is an example embodiment of a data encoding circuit.

FIG. 6 is an example embodiment of a data encoding circuit incorporating tri-level signaling for a plurality of data signals. The example circuit of FIG. 6 may receive a plurality of data input signals D603, D602, D601, and D600. These data input signals determine the operation of a plurality of switches associated with current sources 632, 634, 636, and 638. A plurality of data output signals 610, 611, 612, and 613 are coupled to supply voltage VDD through pull-up resistors 628, 626, 624, and 622, respectively. The voltage levels of output data signals 610-613 are determined by how current is steered by the switches associated with data input signals 600-603. For four data input signals, there are 19 possible output codes that may be placed on output data signals 610-613. Each of the codes may provide for a common mode voltage of approximately 0V for output data signals 610-613. Because each of the codes provides a common mode voltage of approximately 0V, variations in power supply current may be reduced. For an embodiment, it may be desirable to limit the DC average voltage over any two output data lines to a voltage no greater than a voltage approximately equal to one half the voltage difference between the logically intermediate voltage level and the logically high voltage level. Other embodiments may limit the DC average voltage over any two output data lines to other voltage levels, for example to a voltage level approximately equal to the voltage difference between the logically intermediate voltage level and the logically high voltage level. By limiting the DC average voltage over groups of data lines, further reductions in power supply noise may be realized.

For this example where the DC average voltage over any two output data lines is limited to a voltage no greater than a voltage approximately equal to one half the voltage difference between the logically intermediate voltage level and the logically high voltage level, 15 possible codes are available. Table 1 below shows the example relationships between input data signals D600-D603 and output data signals Data 610-613.

TABLE 1

| D603 | D602 | D601 | D600 | Data 613 | Data 612 | Data 611 | Data 610 |
|------|------|------|------|----------|----------|----------|----------|
| 0 | 0 | 0 | 0 | 0 | 0 | 0 | 0 |
| 0 | 0 | 0 | 1 | +1 | 0 | 0 | −1 |
| 0 | 0 | 1 | 0 | 0 | 0 | −1 | +1 |
| 0 | 0 | 1 | 1 | +1 | 0 | −1 | 0 |
| 0 | 1 | 0 | 0 | 0 | −1 | +1 | 0 |
| 0 | 1 | 0 | 1 | +1 | −1 | +1 | −1 |
| 0 | 1 | 1 | 0 | 0 | −1 | 0 | +1 |
| 0 | 1 | 1 | 1 | +1 | −1 | 0 | 0 |
| 1 | 0 | 0 | 0 | −1 | +1 | 0 | 0 |
| 1 | 0 | 0 | 1 | 0 | +1 | 0 | −1 |
| 1 | 0 | 1 | 0 | −1 | +1 | −1 | +1 |
| 1 | 0 | 1 | 1 | 0 | +1 | −1 | 0 |
| 1 | 1 | 0 | 0 | −1 | 0 | +1 | 0 |
| 1 | 1 | 0 | 1 | 0 | 0 | +1 | −1 |
| 1 | 1 | 1 | 0 | −1 | 0 | 0 | +1 |
| 1 | 1 | 1 | 1 | 0 | 0 | 0 | 0 |

Figure 7:
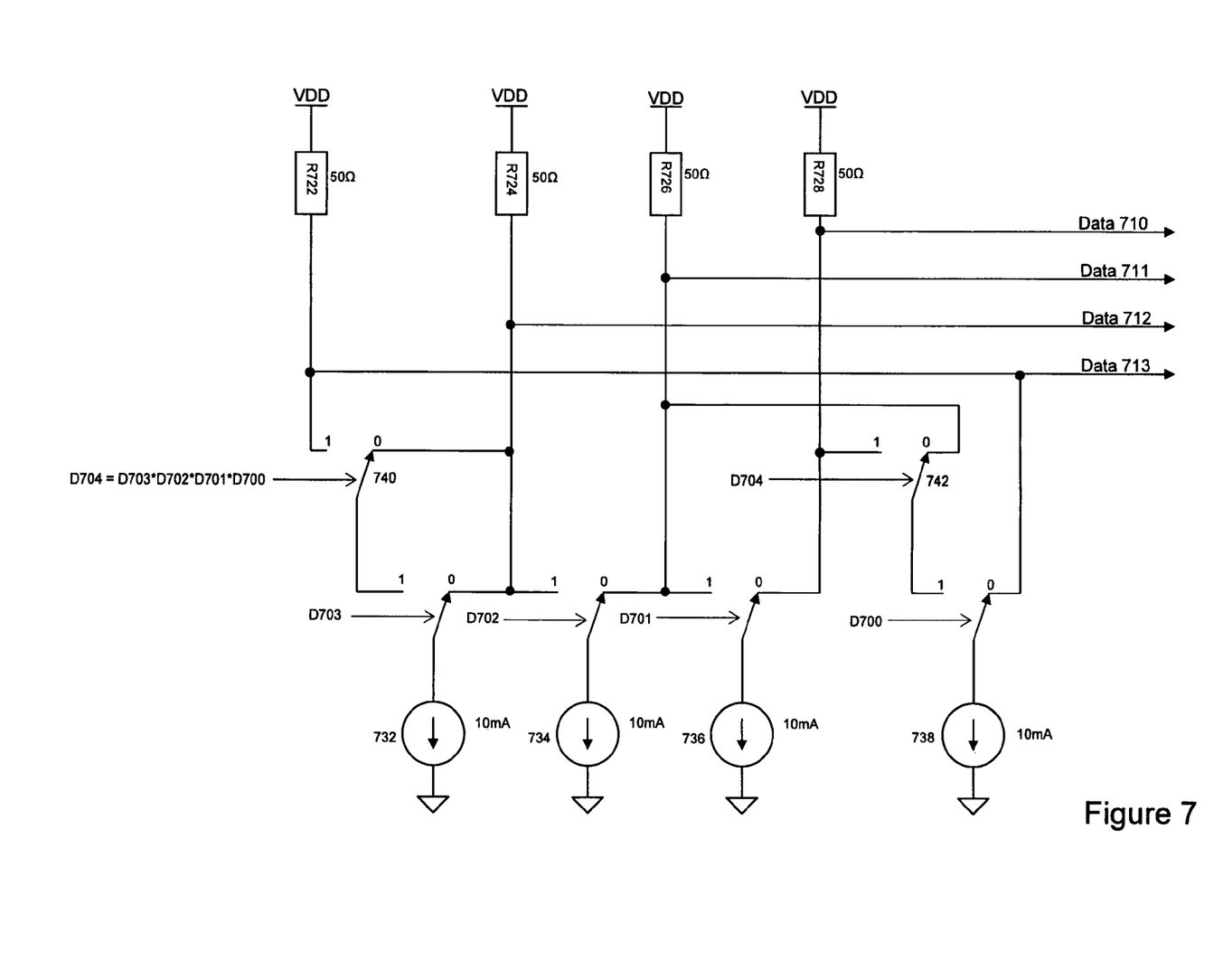
FIG. 7 is an example embodiment of a data encoding circuit.

As can be seen in Table 1, input data combinations 0, 0, 0, 0, and 1, 1, 1, 1 each produce an output code of 0, 0, 0, 0. Additional codes may be available with an addition of additional switches, as shown in FIG. 7. The example circuit of FIG. 7 may receive a plurality of data input signals D703, D702, D701, and D700. These data input signals determine the operation of a plurality of switches associated with current sources 732, 734, 736, and 738. A plurality of data output signals 710, 711, 712, and 713 are coupled to supply voltage VDD through pull-up resistors 728, 726, 724, and 722, respectively. The voltage levels of output data signals 710-713 are determined by how current is steered by the switches associated with data input signals 700-703. The circuit of FIG. 7 includes two additional switches 740 and 742 whose states are determined by the states of data input signals D700-D703. If all of D700-D703 have a value of 1, switches 740 and 742 are at position 0. Otherwise, switches 740 and 742 are at position 1. Each of the output codes for this example may provide a common mode voltage of approximately 0V for output data signals 710-713. Also for this embodiment, the DC average voltage over any two output data lines may be limited to a voltage no greater than a voltage approximately equal to the voltage difference between the logically intermediate voltage level and the logically high voltage level. Table 2 below shows the example relationships between input data signals D700-D703 and output data signals Data 710-713. Note that in Table 2 each of the input data combinations has a unique corresponding output data code.

TABLE 2

| D703 | D702 | D701 | D700 | Data 713 | Data 712 | Data 711 | Data 710 |
|---|---|---|---|---|---|---|---|
| 0 | 0 | 0 | 0 | 0 | 0 | 0 | 0 |
| 0 | 0 | 0 | 1 | +1 | 0 | 0 | −1 |
| 0 | 0 | 1 | 0 | 0 | 0 | −1 | +1 |
| 0 | 0 | 1 | 1 | +1 | 0 | −1 | 0 |
| 0 | 1 | 0 | 0 | 0 | −1 | +1 | 0 |
| 0 | 1 | 0 | 1 | +1 | −1 | +1 | −1 |
| 0 | 1 | 1 | 0 | 0 | −1 | 0 | +1 |
| 0 | 1 | 1 | 1 | +1 | −1 | 0 | 0 |
| 1 | 0 | 0 | 0 | −1 | +1 | 0 | 0 |
| 1 | 0 | 0 | 1 | 0 | +1 | 0 | −1 |
| 1 | 0 | 1 | 0 | −1 | +1 | −1 | +1 |
| 1 | 0 | 1 | 1 | 0 | +1 | −1 | 0 |
| 1 | 1 | 0 | 0 | −1 | 0 | +1 | 0 |
| 1 | 1 | 0 | 1 | 0 | 0 | +1 | −1 |
| 1 | 1 | 1 | 0 | −1 | 0 | 0 | +1 |
| 1 | 1 | 1 | 1 | +1 | −1 | −1 | +1 |

Figure 8:
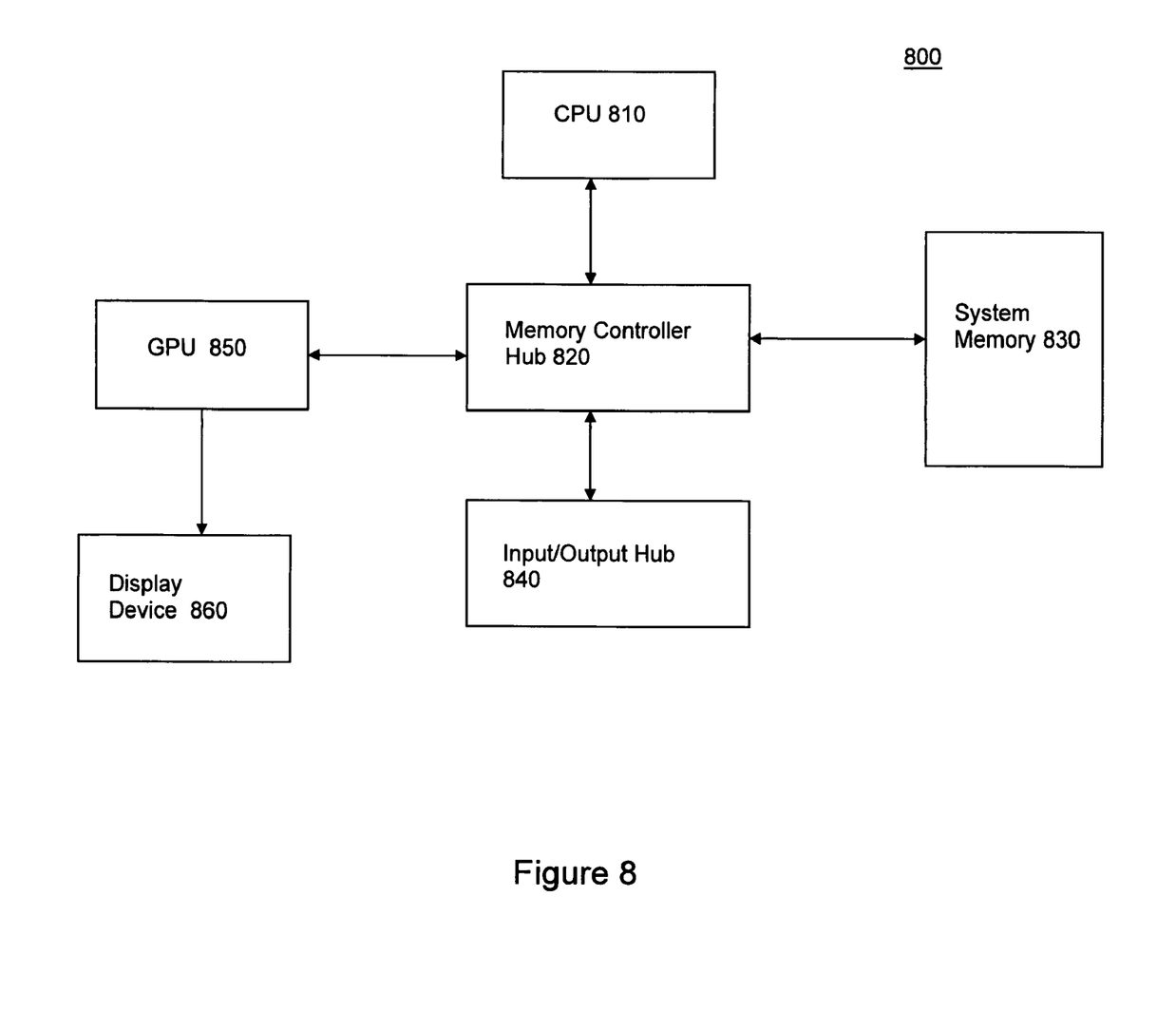
FIG. 8 is an example embodiment of a computing platform.

FIG. 8 is a block diagram of an example embodiment of a computing platform 800. Computing platform 800 includes a CPU 810 and a memory controller hub 820 coupled to CPU 810. Memory controller hub 820 is further coupled to a system memory 830, to a GPU 850, and to an input/output hub 840. GPU 850 is further coupled to a display device 860, which may comprise a CRT display, a flat panel LCD display, or other type of display device.

GPU 850 may comprise an integrated circuit device including circuitry similar to that discussed above in connection with FIGS. 1-7, where the device includes transmitting and receiving units to encode and decode data in accordance to any of the example encoding and decoding embodiments described herein. Further, the example encoding and decoding embodiments described herein may be utilized to transfer data between any of the components of computing platform 800. That is, any of the components of computing platform 800 may comprise transmitting devices and/or receiving devices configured in accordance with the example transmitting and receiving device embodiments described herein.

Although example system 800 is shown with a particular configuration of components, other embodiments are possible using any of a wide range of configurations. Further, the example embodiments described herein may be utilized in any of a wide range of electronic devices, including, but not limited to, computing platforms, gaming devices, cellular phones, personal digital assistants, music players, communications network components, etc.

Although some of the example embodiments described herein use parallel bus widths of four data lines, the claimed subject matter is not limited in this respect. Other embodiments are possible using any of a wide range of parallel bus widths. In some embodiments, wider busses may be implemented by combining two or more narrower bus lanes. For one example, thirty-two data bits may be encoded using eight sets of codes where each code is four bits wide.

Figure 9:
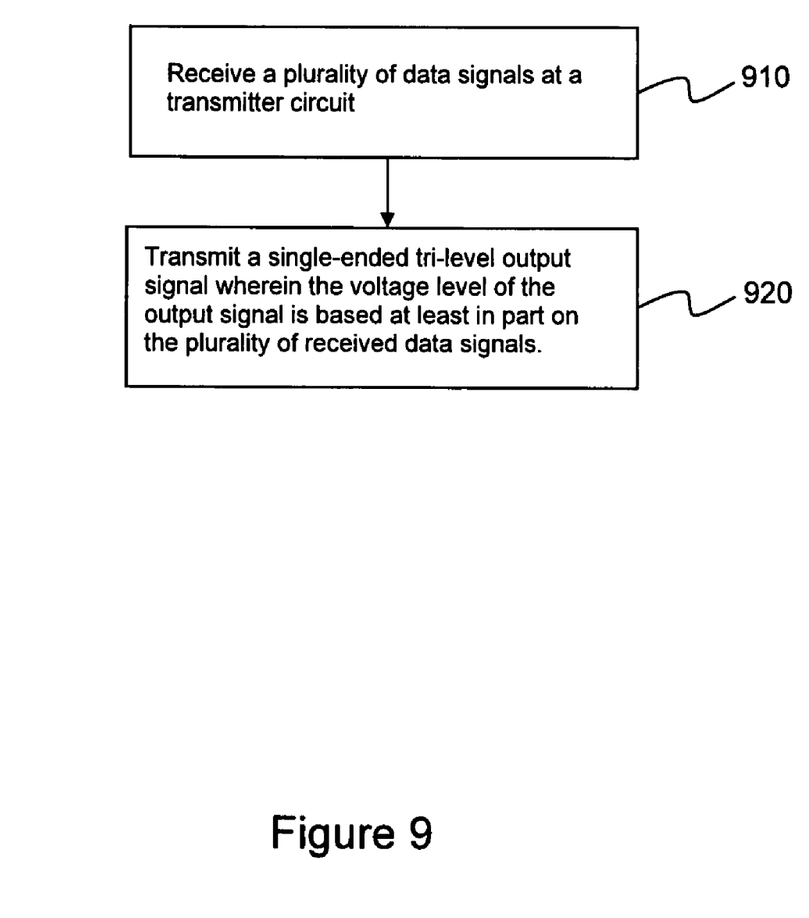
FIG. 9 is a flow diagram of an example embodiment of a method for transmitting a data signal.

FIG. 9 is a flow diagram of an example embodiment of a method for transmitting single-ended tri-level data signals. At block 910, a plurality of data signals may be received at a transmitter circuit. At block 920, a single-ended tri-level output signal is transmitted wherein the voltage level of the output signal is based at least in part on the plurality of received data signals. An embodiment in accordance with claimed subject matter may include all, more than all or less than all of blocks 910-920. Furthermore, the order of blocks 910-920 is merely an example order, and the scope of the claimed subject matter is not limited in this respect.

In the preceding description, various aspects of claimed subject matter have been described. For purposes of explanation, systems and configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. An apparatus, comprising:
a transmitter circuit comprising a plurality of output terminals to transmit a plurality of single-ended tri-level output signals, said plurality of output signals to be individually transmitted at a specified one of three or more states, wherein said three or more states are specified for the plurality of output signals, at least in part, by the states of a plurality of switches coupled to the output terminals, wherein individual output terminals from the plurality of output terminals are coupled to two or more switches of the plurality of switches, and wherein an average voltage level across the plurality of single-ended tri-level output signals at a given point in time is approximately zero volts.

2. The apparatus of claim 1, wherein the transmitter circuit further comprises a plurality of current sources selectively coupled to the output terminals via the plurality of switches, wherein for a first output terminal of said plurality of output terminals, a first current source and a second current source of said plurality of current sources are selectively coupled to the first output terminal via first and second switches of said plurality of switches based, at least in part, on first and second data signals from a plurality of binary data signals, respectively.

3. The apparatus of claim 2, wherein if neither the first nor the second current source are coupled to the first output terminal, a respective first output signal comprises a voltage level indicating a tri-level value of "1".

4. The apparatus of claim 3, wherein if the first current source is coupled to the first output terminal and if the second current source is not coupled to the first output terminal, the first output signal comprises a voltage level indicating a tri-level value of "0".

5. The apparatus of claim 4, wherein if both the first and second current sources are coupled to the first output terminal, the first output signal comprises a voltage level indicating a tri-level value of "−1".

6. The apparatus of claim 5, wherein a DC average voltage level of a group of any two of the plurality of single-ended tri-level output signals is limited to a voltage no greater than a voltage approximately equal to one half of the voltage difference between a voltage level indicating the tri-level value of "0" and a voltage level indicating the tri-level value of "1".

7. The apparatus of claim 5, wherein a DC average voltage level of a group of any two of the plurality of single-ended tri-level output signals is limited to a voltage no greater than a voltage approximately equal to the voltage difference between a voltage level indicating the tri-level value of "0" and a voltage level indicating the tri-level value of "1".

8. The apparatus of claim 2, wherein said plurality of output signals comprises N output signals, and wherein said plurality of data signals comprises N data signals.

9. The apparatus of claim 8, wherein the plurality of single-ended tri-level output signals have a common-mode voltage of approximately zero volts.

10. The apparatus of claim 8, wherein said plurality of switches comprises N or more switches, and wherein said plurality of current sources comprises N current sources.

11. The apparatus of claim 1, wherein the apparatus comprises a graphics processing unit.

12. The apparatus of claim 11, wherein said plurality of single-ended tri-level output signals are transmitted to a graphics memory device.

13. The apparatus of claim 1, wherein the apparatus comprises a memory device.

14. The apparatus of claim 13, wherein said plurality of single-ended tri-level output signals are transmitted to a graphics processing device.

15. A method, comprising:
transmitting a plurality of single-ended tri-level output signals via a plurality of output terminals coupled to a transmitter circuit, wherein said transmitting comprises individually transmitting the plurality of single-ended tri-level output signals at a specified one of three or more states, wherein said three or more states are specified for the plurality of output signals, at least in part, by the states of a plurality of switches coupled to the output terminals, wherein individual output terminals from the plurality of output terminals are coupled to two or more switches of the plurality of switches, and wherein an average voltage level across the plurality of single-ended tri-level output signals at a given point in time is approximately zero volts.

16. The method of claim 15, wherein said transmitting said plurality of single-ended tri-level output signals further comprises selectively coupling a plurality of current sources to the plurality of output terminals via the plurality of switches, and wherein said transmitting said plurality of single-ended tri-level output signals further comprises transmitting a first output signal of the plurality of output signals by selectively coupling first and second current sources of said plurality of current sources to a first output terminal of said plurality of output terminals via first and second switches of the plurality of switches based, at least in part, on first and second data signals from a plurality of binary data signals.

17. The method of claim 16, wherein said transmitting the plurality of single-ended tri-level output signals comprises:
transmitting a first output signal via a respective first output terminal, wherein the first output signal comprises a voltage level indicating a tri-level value of "1" if neither the first nor the second current source are coupled to the first output terminal, a tri-level value of "0" if the first current source is coupled to the first output terminal and the second current source is not coupled to the first output terminal, and a tri-level value of "−1" if the first and second current sources are coupled to the first output terminal.

18. The method of claim 16, wherein the plurality of single-ended tri-level output signals comprises N single-ended tri-level signals, the plurality of output terminals comprises N output terminals, the plurality of switches comprises N or more switches, and the plurality of data signals comprises N data signals.

19. The method of claim 16, wherein a DC average voltage level of a group of any two of the plurality of single-ended tri-level output signals is limited to a voltage no greater than a voltage approximately equal to the voltage difference between a voltage level indicating the tri-level value of "0" and a voltage level indicating a tri-level value of "1".

20. An apparatus, comprising:
means for transmitting a plurality of single-ended tri-level output signals via a plurality of output terminals, wherein said means for transmitting comprises means for individually transmitting the plurality of single-ended tri-level output signals at a specified one of three or more states, wherein said three or more states are specified for the plurality of output signals, at least in part, by the states of a plurality of means for switching coupled to the output terminals, wherein individual output terminals from the plurality of output terminals are coupled to two or more means for switching of the plurality of means for switching, and wherein an average voltage level across the plurality of single-ended tri-level output signals at a given point in time is approximately zero volts.

21. A method, comprising:
receiving a single-ended tri-level signal from a transmitting device;
comparing the received signal with a first threshold voltage level and with a second threshold voltage level, wherein the first threshold voltage level is higher than the second threshold voltage level; and
decoding the received signal to generate first and second data signals, wherein if the received signal exceeds the first threshold voltage level, the first data signal is generated with a voltage level indicating a binary value of "1," and the second data signal is generated with a voltage level indicating a binary value of "0", wherein if the received signal does not exceed the second threshold voltage level and does not exceed the first threshold voltage level, the first data signal is generated with the voltage level indicating the binary value of "0" and the second data signal is generated with the voltage level indicating the binary value of "1", and wherein if the received signal exceeds the second threshold voltage level and does not exceed the first threshold voltage level, the first data signal is generated with the voltage level indicating the binary value of "0" and the second data signal is generated with the voltage level indicating the binary value of "0".

* * * * *